United States Patent [19]

Suzuki et al.

[11] Patent Number: 4,691,831

[45] Date of Patent: Sep. 8, 1987

[54] IC TEST EQUIPMENT

[75] Inventors: Kempei Suzuki; Yushi Iwanaga; Hiroshi Sato; Kohei Sato; Noriyuki Igarashi; Shinichi Koya, all of Tokyo, Japan

[73] Assignee: Takeda Riken Co., Ltd., Tokyo, Japan

[21] Appl. No.: 747,560

[22] Filed: Jun. 21, 1985

[30] Foreign Application Priority Data

Jun. 25, 1984 [JP] Japan .............................. 59-95641[U]
Jun. 27, 1984 [JP] Japan .............................. 59-97581[U]
Jun. 29, 1984 [JP] Japan .............................. 59-98841[U]

[51] Int. Cl.⁴ ............................................. B07C 5/344
[52] U.S. Cl. .................................. 209/573; 198/360; 198/463.4; 198/468.6; 198/535; 324/73 AT; 324/158 F
[58] Field of Search ................... 209/571, 573–575; 324/158 F, 73 AT; 198/463.4, 468.6, 535, 360; 193/39, 40

[56] References Cited

U.S. PATENT DOCUMENTS

| 3,701,021 | 10/1972 | Isaac et al. | 324/158 F |
| 3,716,786 | 2/1973 | Gearin | 209/573 X |
| 4,000,798 | 1/1977 | Cedrone | 193/40 |
| 4,222,166 | 9/1980 | Kurek et al. | 414/404 X |
| 4,234,418 | 11/1980 | Boissicat | 209/573 X |
| 4,423,815 | 1/1984 | Boissicat | 209/573 X |
| 4,506,213 | 3/1985 | O'Connor | 324/73 AT |
| 4,588,092 | 5/1986 | Moechnig et al. | 209/573 |

FOREIGN PATENT DOCUMENTS

| 56-160668 | 12/1981 | Japan | 324/158 F |
| 57-17871 | 1/1982 | Japan | 324/158 F |
| 60-15568 | 1/1985 | Japan | 324/158 F |

Primary Examiner—Robert B. Reeves
Assistant Examiner—Edward M. Wacyra
Attorney, Agent, or Firm—Staas & Halsey

[57] ABSTRACT

An IC element supplied to a testing station is guided by a rail and a guide member to move by its own weight. At least one of the rail and guide member has built therein plate-shaped ceramic heater or plate-shaped silicone rubber heater. The guide member urges the IC element against the rail to heat the IC element. An auxiliary stopper is provided opposite but aslant to the IC element sliding surface of the rail. The IC element moving on the rail is yieldingly urged by the auxiliary stopper against the sliding surface of the rail, braked and engages an engaging piece at the lower end of the auxiliary stopper. The IC element is disengaged from the engaging piece to slightly move and stopped by a main stopper, where the IC element is tested. A plurality of such testing passages are provided, and IC elements simultaneously tested in the testing passage are fed to discharge rails respectively corresponding thereto. A plurality of sorting rails are provided in a manner to be movable in the direction of arrangement of the discharge rails, and the spacing of the discharge rails and the spacing of the sorting rails are selected equal to each other so that the IC elements on the discharge rails are simultaneously transferred to the sorting rails. The sorting rails move in a direction in which a plurality of receiving passages of an unloader are arranged at intervals different from those of the sorting rails. One of the sorting rails is selectively connected to one of the receiving passages according to the test results, feeding the IC element on the rail to the unloader.

14 Claims, 16 Drawing Figures

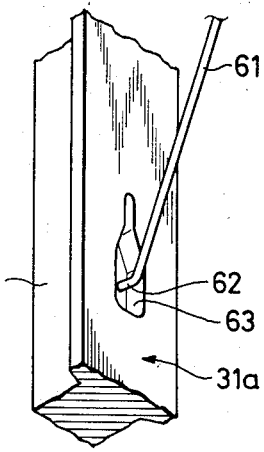
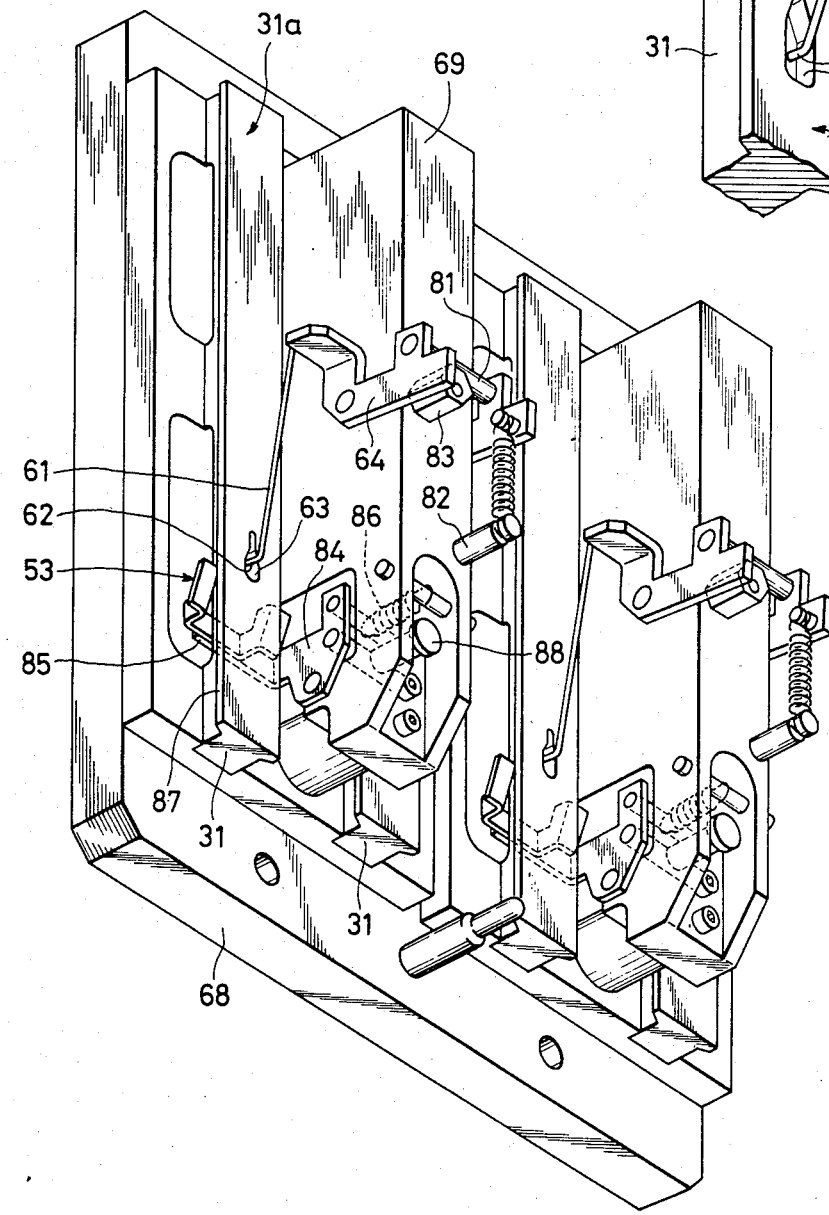

IC TEST EQUIPMENT

BACKGROUND OF THE INVENTION

The present invention relates to IC test equipment, and more particularly to its IC loading-unloading arrangement which feeds IC elements to a testing station, sorts them according to their test results and houses them in an unloading station.

In this kind of IC test equipment, an IC element supplied to a testing station is guided sliding on a rail and once stopped by an auxiliary stopper immediately before a test position, and then the auxiliary stopper is released to let the IC element slightly slide on the rail toward the test position, where it is stopped by a main stopper. In the case where no such an auxiliary stopper is provided and hence the IC element is stopped directly by the main stopper, if the IC element slides down fast, it often strikes so hard against the main stopper that terminal pins of the IC element are bent to make it defective and its test cannot be effected at the correct position. Sometimes the testing station is designed to let the IC element down by its own weight substantially vertically to the test position, and in such an instance, its descending speed is appreciably high.

Conventionally, the auxiliary stopper is formed by a resilient wire, which is disposed opposite but aslant to one side of the rail and the lower end of which is held in resilient contact with the rail so that the terminal pins of the IC element sliding down the rail come into contact with the auxiliary stopper whereby the element is braked to stop. Since IC elements vary in weight five to six times or more according to their types, their kinetic energy during movement considerably scatters, and their thicknesses and widths also substantially differ. Therefore, the position where the IC elements are stopped by the auxiliary stopper appreciably varies, and even if the auxiliary stopper is employed, their terminal pins are often bent when they are stopped by the main stopper. Moreover, since the auxiliary stopper is held in resilient contact with the side surface of the rail, the contact surface of the rail with the auxiliary stopper is sometimes worn or scratched by repeated engagement and disengagement between the auxiliary stopper and IC elements, introducing the possibility that terminal pins of the IC element are caught by such worn or scratched surface of the rail and the element cannot be moved to the main stopper. Further, when the IC element is slid down vertically, a guide member is disposed opposite the sliding surface of the rail so as to prevent the IC element from running off the rail. The guide member is made movable so that the testing station can be inspected, but when the guide member is moved back away from the rail, the IC element held by the auxiliary stopper on the rail falls off because only the terminal pins of the element are urged against one side of the rail.

Sometimes IC elements are tested at a predetermined elevated temperature. In this instance, in order to heat the IC elements to the predetermined temperature in the testing station, or to hold preheated IC elements at that temperature, a heater is provided in the testing station. A guide member is positioned opposite the IC element sliding surface of the rail for preventing it from running off the rail, and the heater is incorporated in the guide member or the rail, or provided between them. In the prior art, a recess or groove is cut in the guide member or rail to extend in its lengthwise direction and a bar-shaped heater is buried in the groove. The bar-shaped heater is coated with silicone grease so as to facilitate good conduction of heat from the heater to the guide member or rail.

However, since the bar-shaped heater is appreciably low in temperature at both ends thereof and since the heater is buried in a long and thin groove, temperature in the contact surface of the guide member or rail with the IC element is not uniformly distributed, and consequently, the IC element cannot satisfactorily be heated. Besides, the use of the silicone grease involves an additional step therefor in the manufacture of the equipment.

With a view to speeding up the test, there has been proposed equipment which has two testing passages in the testing station for simultaneously testing IC elements in both passages. According to this prior art equipment, the tested IC elements are transferred onto discharge rails respectively corresponding to the passages, and in a sorting station, the IC elements are transferred from one of the discharge rails to one sorting rail, which is moved in the direction of arrangement of a plurality of receiving rails, and the IC elements on the sorting rail are each delivered onto a predetermined one of the receiving rails according to its test results, that is, depending upon whether it is non-defective or defective, or according to its quality. Thereafter, the IC elements on the other discharge rail are similarly transferred to the sorting rail and then selectively delivered to the receiving rails.

With such a sorting station, a relatively long time is needed for transferring the IC elements to the unloading station. This poses a problem in the processing speed in the sorting station especially when the time for testing one IC element is short, or when more testing passages are provided.

SUMMARY OF THE INVENTION

It is therefore an object of the present invention to provide IC test equipment which is capable of stopping IC elements by an auxiliary stopper at a predetermined position at all times.

Another object of the present invention is to provide IC test equipment which is capable of providing a uniform temperature distribution in the surface of a heating part for contact with an IC element for heating it and which allows ease in assembling the heating part.

Another object of the present invention is to provide IC test equipment in which a sorting station is relatively simple in arrangement and occupies a relatively small space, and therefore, tested IC elements can quickly be transferred to an unloading station.

In accordance with one aspect of the present invention, in the testing station IC elements supplied thereto from a loading station are each guided to slide on a rail, and an auxiliary stopper is provided opposite the IC element sliding surface of the rail. The auxiliary stopper is disposed aslant so that it goes away from the sliding surface of the rail as the IC element supply side, and the end portion of the auxiliary stopper on the side opposite from the IC element supply side is bent substantially perpendicularly to the sliding surface of the rail to form an engaging piece. The IC element sliding down the rail is yieldingly urged by the auxiliary stopper against the sliding surface and braked thereby and then stopped by engagement with the engaging piece. Accordingly, the IC element stops at a predetermined position at all times. A main stopper is provided a little ahead of the position of the engaging piece, and the IC element disengaged from the auxiliary stopper is stopped by the main stopper after moving a fixed distance.

A recess is made in the sliding surface of the rail in opposing relation to the engaging piece, as required. This prevents the tip of the engaging piece from colliding against the sliding surface of the rail to scratch the surface, making it uneven. Further, even if the length of the engaging piece is increased, it is possible to ensure the engagement of the engaging piece with the IC element irrespective of variations in its size, shape and weight, and to sufficiently brake the IC element. Moreover, biasing means, for example, a coiled spring, is provided for baising the engaging piece of the auxiliary stopper and means is provided for adjusting the distance between the engaging piece and the sliding surface of the rail, as required. By adjusting the above distance according to the kind of the IC element, the operation of the auxiliary stopper can be ensured.

In accordance with another aspect of the present invention, a guide member is provided in opposing relation to the sliding surface of the rail in the testing station. A heater is incorporated in at least one of the guide member and the rail so that by gripping an IC element between the guide member and the rail, the IC element is heated. To this end, at least one of the guide member and the rail has its innermost layer formed by a heating member of a heat-resisting material of excellent heat conductivity, on the outer surface of which is mounted a plate-shaped ceramic heater with a heat-resisting resilient layer of excellent heat conductivity interposed therebetween. The ceramic heater has a heating wire buried in a ceramic sheet so that it is heated substantially uniformly throughout it. A relatively hard heater holder of poor heat conductivity is mounted on the outer surface of the plate-shaped ceramic heater with a heat-insulating layer of a heat-resisting resilient material of poor heat conductivity sandwiched therebetween. The plate-shaped ceramic heater is pressed by the heater holder toward the heating member.

Since at least one of the guide member and the rail is constructed as described above, its contact surface with the IC element is uniformly heated. Also the guide member or rail for heating the IC element can easily be produced simply by laminating plate-like members.

In accordance with another aspect of the present invention, either one or both of the guide member and rail for heating the IC element have a plate-shaped silicone rubber heater mounted on the outer surface of the heating member and the heater holder on the outer surface of the silicone rubber heater. The silicone rubber heater has a heating wire buried in a silicone rubber sheet so that it is heated substantially uniformly throughout it.

In the case where the IC element from the loading station is preheated in a preheating station and then supplied to the testing station, the preheating station is formed by a rail and a guide for guiding the IC element so that it is gripped by the rail and the guide member for heating. At least one of the rail and the guide member can be formed by a member having incorporated therein the abovesaid plate-shaped ceramic heater or silicone rubber heater.

In accordance with still another aspect of the present invention, the testing station has a plurality of testing passages so that IC elements can simultaneously be tested in the respective passages. The IC elements in these testing passages are indivdually supplied to discharge rails. A plurality of sorting rails are arranged in the direction of arrangement of the discharge rails, and the spacing of the sorting rails is selected equal to the spacing of the discharge rails. The sorting rails are adapted to be movable in the direction of arrangement of the discharge rails concurrently. The plurality of sorting rails are simultaneously positioned in alignment with the plurality of discharge rails and the IC elements on the respective discharge rails are concurrently supplied to the sorting rails. A plurality of receiving passages are provided on the opposite side from the discharge rails with respect to the sorting rails. The receiving passages are arranged in the direction of movement of the sorting rails, and the spacing of the receiving passages is selected different from the spacing of the sorting rails. Each sorting rail is provided with a stopper for holding the IC element supplied thereto, and a common driving member is disposed to extend in the direction of movement of the sorting rails. The driving member has releasing pieces in its lengthwise direction at the same intervals as those of the receiving passages for engagement with the stoppers of the sorting rails. By driving the driving member in a state in which one of the sorting rail is aligned with one of the receiving passages, one of the releasing pieces engages the stopper of the sorting rail and the stopper is driven to release the IC element on the sorting rail, transferring the element to the above receiving passage. The receiving passages are each formed by a rail, through which the IC element is received by the corresponding magazine. The receiving passages may also be passages through which IC elements are supplied from the sorting rails directly to the magazines.

BRIEF DESCRIPTION OF THE DRAWINGS

FIG. 6 is a perspective view showing, by way of example, the relation between a recess made in a sliding surface of a rail and an engaging piece 62;

FIG. 7 is a perspective view showing a specific example of the part depicted in FIG. 5;

DESCRIPTION OF THE PREFERRED EMBODIMENTS

To facilitate a better understanding of the present invention, a description will be given first, with reference to FIGS. 1 and 2, of the general arrangement of IC test equipment of the present invention.

Figure 3:
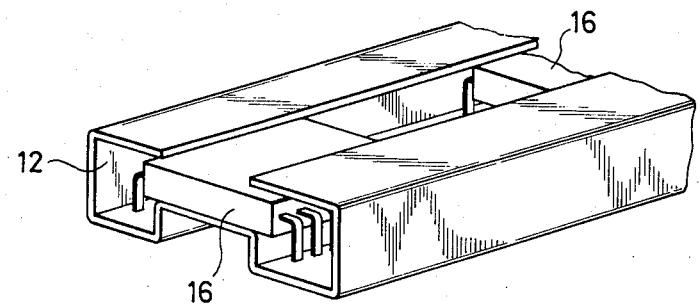
FIG. 3 is a perspective view showing a part of an example of an IC housing magazine.

In a magazine stocker 13 of an automatic loading station or loader 11 are stored a number of bar-shaped IC containers commonly referred to as magazines 12, in each of which oriented IC elements 16 are aligned, as shown in FIG. 3. The magazines 12 housed in the magazine stocker 13 are brought up one by one, by means of a lift mechanism, though not shown, to an IC element feed position where the magazine 12 is disposed aslant forwardly, as indicated by 12a in FIG. 1. After releasing all the IC elements from the magazine 12, another magazine is automatically pulled up to the IC element feed position.

The IC elements 16 in the magazine 12 are fed onto a rail 15 of an intermittent feed mechanism 14 and held there by a holder 17. The IC elements 16 thus held on the rail 15 are automatically fed one by one, by their own weight, to a distributor 18 disposed downwardly of the intermittent feed mechanism 14. The distributor 18 is constituted by a plurality of moving rails 21 arranged on a carrier 19. The carrier 19 moves in a direction perpendicular to the direction of feed of the IC elements 16 from the intermittent feed mechanism 14 so that the IC elements 16 are distributed onto the rails 21. The moving rails 21 are arranged at substantially regular intervals.

Disposed downwardly of the distributor 18 is a preheating station 22, in which plural, eight heating rails 23 in this example, are arranged side by side. The spacing of the heating rails 23 is selected equal to the spacing of the moving rails 21 so that the IC elements 16 can simultaneously be fed from the moving rails 21 onto the corresponding heating rails 23. The preheating station 22 is provided with guides 25 which are disposed in opposing relation to the heating rails 23 and can be moved back and forth with respect to them. The guides 25 prevent the IC elements 16 from running off the heating rails 23 when sliding down them. When heating the IC elements 16 by heaters 24 incorporated in the heating rails 23, the guides 25 are brought down to urge the IC elements 16 against the rails 23. At this time, the IC elements 16 are heated by the heaters 26 provided in the guides 25 as well. At the lower end portion of the preheating station 22 is provided an intermittent feed mechanism 27, by which IC elements 16 heated by the preheating station 22 are fed one by one to a direction changing mechanism 28. In this instance, the intermittent feed mechanism 27 presses only the IC elements 16 second from the bottom, letting the lowermost elements 16 come down to the direction changing mechanism 28. The direction changing mechanism 28 reverses the orientation of the IC elements 16 by turning upside down the rails on which the IC elements 16 are mounted.

The lower end of each rail thus turned upside down by the direction changing mechanism 28 is continuous to the upper end of a testing station 29. The testing station 29 is provided with eight heating rails 31 which respectively receive eight IC elements 16 which are simultaneously supplied from the direction changing mechanism 28. The heating rails 31 extend substantially vertically and have heaters 32 incorporated therein respectively. The IC elements 16, which slide down the heating rails 31, are guided by a guide member 33 so that they do not run off the rails 31. The guide member 33 has incorporated therein heaters 34 for heating the IC elements 16 while urging them against the heating rails 31. The testing station 29 is provided with a mechanism which performs a predetermined test of each IC element 16 with its terminal pins held in touch with contacts, though not shown. In general, a tester head equipped with the above contacts is detachably mounted on the testing station 29 on the opposite side from the guide member 33 so that it supplies test signals to the IC element placed in the testing station 29 at a test position and receives its outputs. The tester head is connected to the test equipment. Incidentally, the testing station 29 also constitutes a main heating station to keep the IC elements 16 at a preset temperature.

The IC elements 16 thus tested are respectively supplied to discharge rails 35 provided just under the testing station 29. The discharge rails 35 are connected to a sorting station 36. The sorting station 36 has sorting rails 37 which are movable in the direction of arrangement of the discharge rails 35. The tested IC elements 16 are supplied from the discharge rails 35 to the sorting rails 37, which are moved so that the IC elements 16 are selectively fed onto non-defective or defective product rails 38 depending upon the test results, i.e. depending upon whether they are non-defective or defective. The rails 38 are arranged in the direction of movement of the sorting rails 37. The rails 37 are respectively linked with those of magazines 41 in an automatic unloading station or unloader 39 corresponding to them, to which are supplied the IC elements 16 from the rails 38. In this way, the IC elements 16 are distributed onto, for example, eight measuring passages in this example, and tested in parallel, thereafter being sorted and fed to the different magazines 41 in the common unloader 39 depending upon whether they are non-defective or defective.

Incidentally, conventional test equipment of this kind is usually provided with two measuring passages and the sorting mechanism uses only one sorting rail. With a view to rapid processing by the sorting station 36, however, the present invention employs the plurality of sorting rails 37 so as to simultaneously receive the IC elements 16 from the plurality of discharge rails 35.

Figure 1:
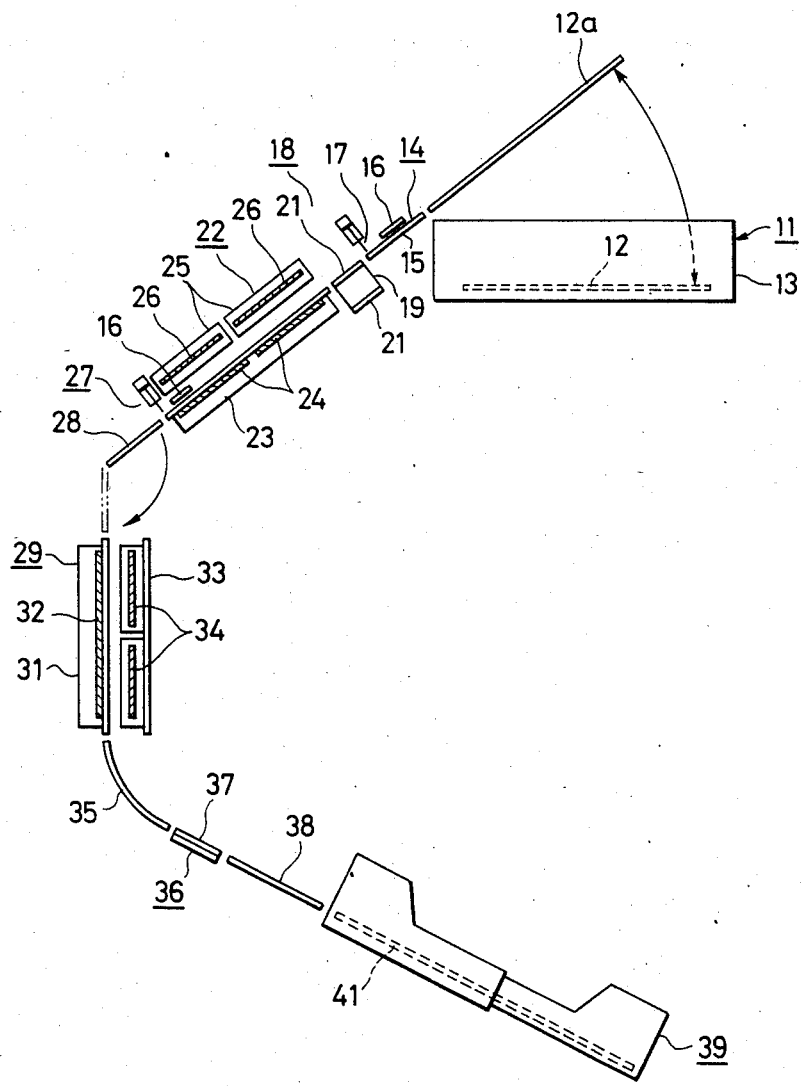
FIGS. 1 is a side view showing the outline of movement of IC elements in the IC test equipment of the present invention.
Figure 2:
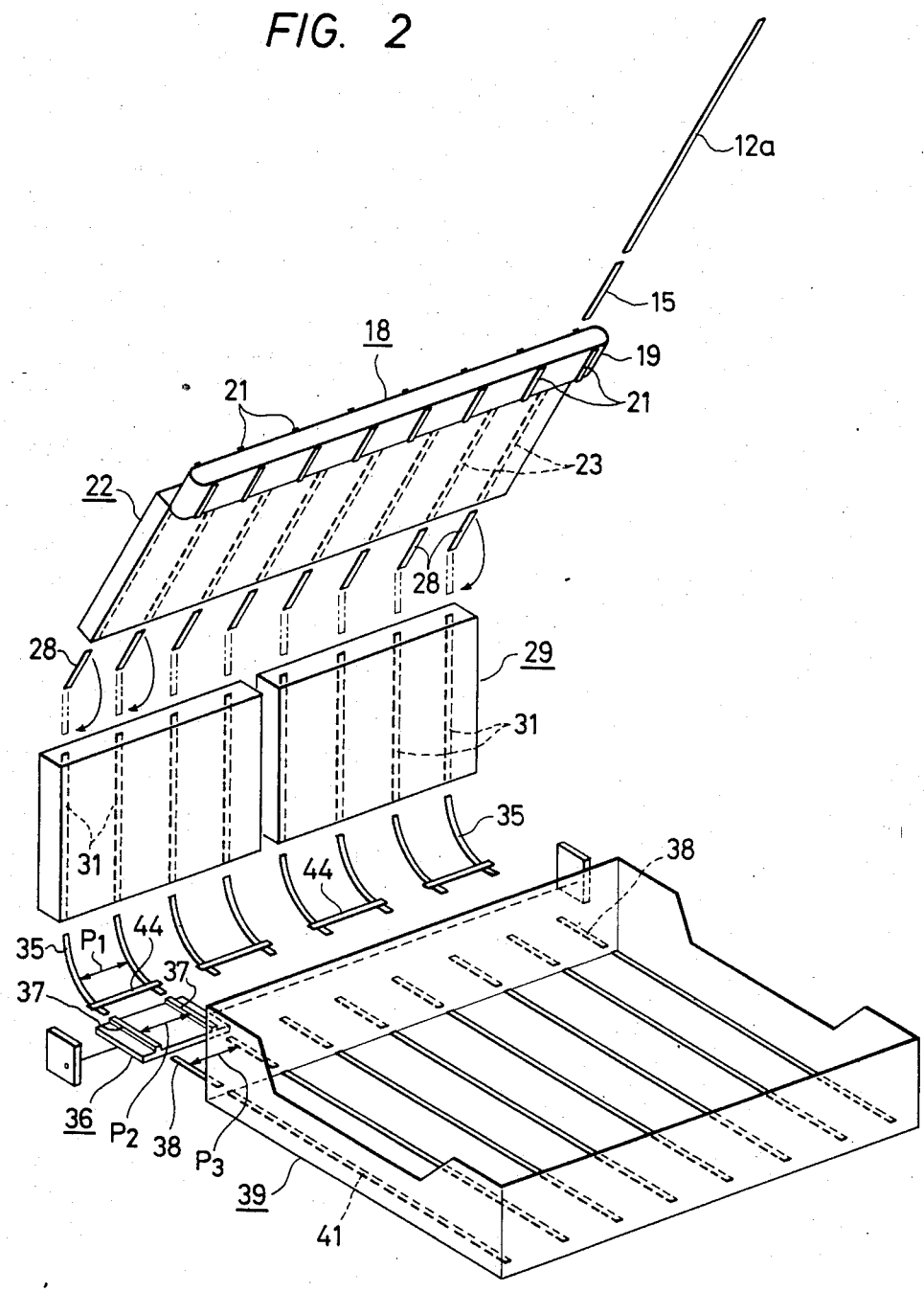
FIG. 2 is a perspective view of the equipment shown in FIG. 1.
Figure 4:
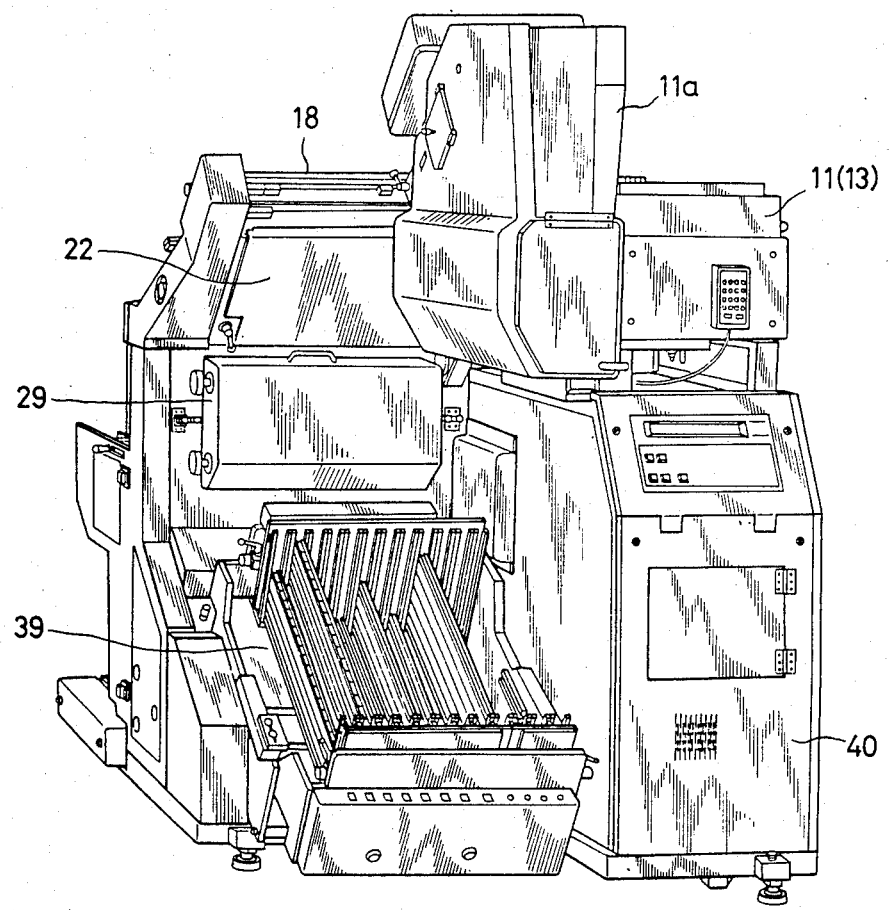
FIG. 4 is perspective view showing the outside appearance of an example of the IC test equipment of the present invention.

FIG. 4 shows an external appearance of the equipment depicted in FIGS. 1 and 2. In FIG. 4, the like parts corresponding to those in FIGS. 1 and 2 are identified by the same reference numerals. Disposed on a controller 40 is the magazine stocker 13 of the automatic loader 11, at one side of which is provided the lift mechanism indicated by 11a. At one side of the controller 40 the distributor 18, the preheating station 22, the testing station 29, the automatic unloader 39 and so forth are provided in this order. The guide members 25 and 33 of the preheating station 22 and the testing station 29 are adapted to be detachable. The controller 40 controls the respective parts of the equipment.

Figure 5:
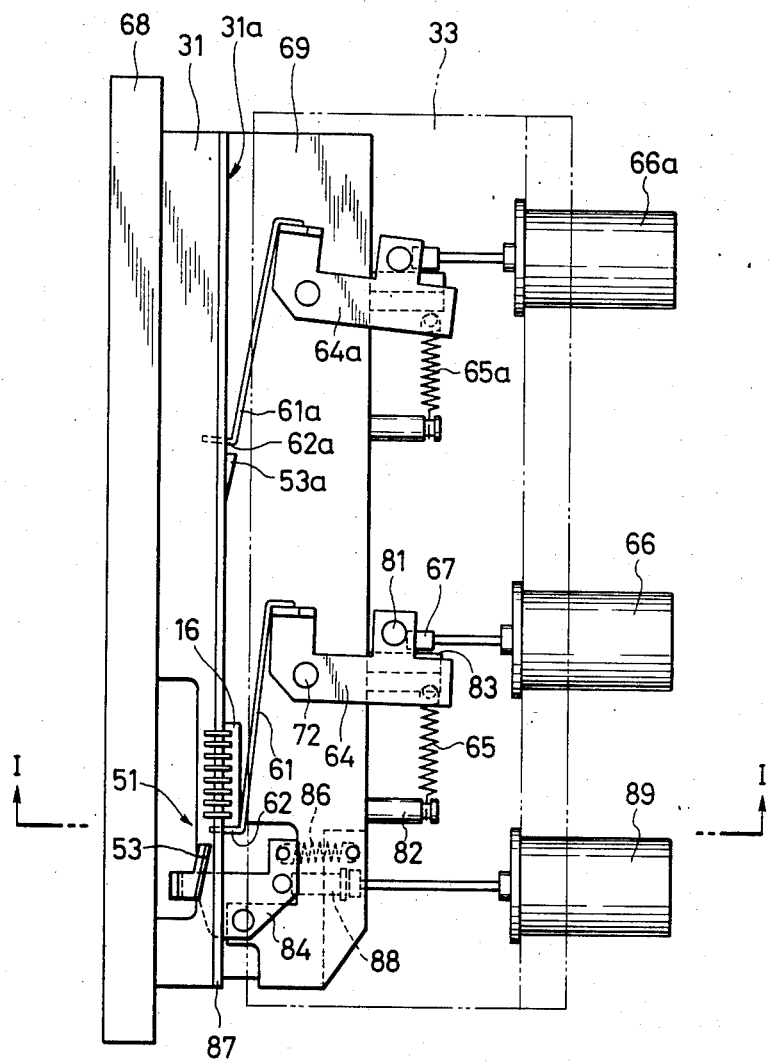
FIG. 5 is a side view illustrating an example of an IC stop mechanism in a testing station which is one of the principal part of the present invention.

In the testing station 29, as shown in FIG. 5, each heating rail 31 is extended, for instance, vertically, and the IC element 16 slides down along the rail 31 while being guided by the guides 33 so as not to run off the rail 31. The IC element 16 is initially stopped by an auxiliary stopper 61 at a position immediately before it reaches a testing position 51. The auxiliary stopper 61 is a long and thin member of a resilient material, such as a piano wire, and it is disposed opposite but obliquely to the sliding surface 31a of the rail 31 so that its lower end approaches the sliding surface 31a toward the testing position 51. The lower end portion of the auxiliary stopper 61 is bent substantially at right angles toward the sliding surface 31a of the rail 31 to form an engaging piece 62. If necessary, the engaging piece 62 is positioned in a recess 63 made in the sliding surface 31a, as depicted in FIG. 6. Since the spacing of the sliding surface 31a of the rail 31 and the auxiliary stopper 61 becomes gradually smaller, the IC element 16 sliding down the rail 31 comes into contact with the auxiliary stopper 61 to slow down, finally strikes against the engaging piece 62 and stops there.

The auxiliary stopper 61 is adapted to be able to back off from the sliding surface 31a to let the IC element 16 down. For example, the upper end of the auxiliary stopper 61 is secured to one end of a rotary arm 64, the other end of which is biased by a colied spring 65 to rotate, bringing the engaging piece 62 into the recess 63. Adjacent the other end of the rotary arm 64 is provided an actuator 67 of a pneumatic cylinder 66. By projecting out the actuator 67 from the pneumatic cylinder 66, the rotary arm 64 is turned counterclockwise in FIG. 5 to push the upper end of the auxiliary stopper 61 to pull the engaging piece 62 apart from the sliding surface 31a, disengaging from the IC element 16. In consequence, the IC element 16 slightly goes down and stopped by a main stopper 53 at a correct testing position 53. A releasing mechanism for the main stopper 53 will be described later. Incidentally, FIG. 5 shows the case where when the IC element 16 is stopped by the main stopper at the testing position, the IC element 16 to be tested next is held on standby above the auxiliary stopper 61. To perform this, another auxiliary stopper 61a is provided which has the same structure as the above auxiliary stopper 61 and has an engaging piece 62a. In association with the auxiliary stopper 61a, a rotary arm 64a, a coiled spring 65a and a pneumatic cylinder 66a are also provided. Immediately below the auxiliary stopper 61a is also provided a main stopper 53a.

Figure 8:
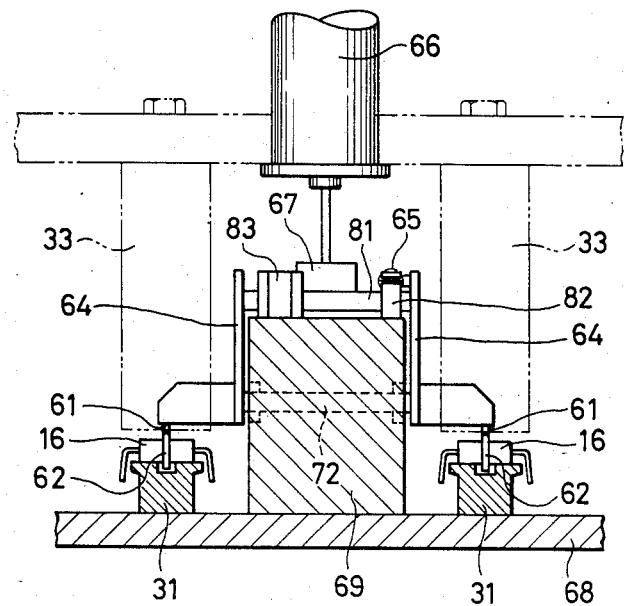
FIG. 8 is a sectional view taken on the line I—I in FIG. 5.

FIGS. 7 and 8 illustrate a part of the structure of the stopper mechanism used in the equipment shown in FIG. 4 though the standby stopper mechanism is not shown. Between adjacent heating rails 31 is protrusively provided a mounting block 69 on a base 68. The guide members 33 are provided opposite the rails 31, respectively. The IC element 16 is guided down gripped between the rail 31 and the guide members 33. The rotary arms 64 shown in FIG. 5 are respectively disposed between the mounting block 69 and the guide members 33 on both side thereof, and are fixed to opposite ends of a rotary shaft 72 which passes through the mounting block 69. One end of each rotary arm 64 is bent and extended toward the rail 31, and one end of the auxiliary stopper 61 is fixed to the extended end of the rotary arm 64. Between the other ends of the rotary arms 64 is bridged a coupling rod 81 above the mounting block 69. The actuator 67 of the pneumatic cylinder 66 is disposed opposite the coupling rod 81. The rotary arms 64 are each biased by the coiled spring 65 retained at one end to a pin 82 planted on the mounting block 69.

When held at a standstill by the auxiliary stopper 61, the IC element 16 is urged by the auxiliary stopper 61 against the sliding surface 31a of the rail 31 and held in engagement with the engaging piece 62. Accordingly, in the case of inspecting the inside of the equipment with the guide members 33 held apart from the base 68, the IC elements 16 are held by the auxiliary stoppers 61 and do not slide down the rails 31.

In this example, the position of the engaging piece 62 relative to the sliding surface 31a of the rail 31 can be adjusted according to the type of the IC element 16 being tested. Adjacent the coupling rod 81 is rotatably mounted a hexagonal adjustment pillar 83 on the mounting block 69 on the side of the pin 82, and its center of rotation is eccentric relative to the axis of the hexagonal pillar 83. Accordingly, the position of the engaging piece 69 relative to the sliding surface 31a of the rail 31 varies depending upon which side of the hexagonal pillar 83 is contacted with the coupling rod 81. A rotary lever 84 is rotatably mounted on one side of the mounting block 69, as shown in FIGS. 5 and 7. The rotary lever 84 is connected at one end to the main stopper 53 through a coupling arm 85 and at the other end to a coiled spring 86 so that it is biased to turn to bring the main stopper 53 into engagement with a side flange of the rail 31. By causing a piston of a pneumatic cylinder 89 to push an actuating piece 88 coupled with the rotary lever 84, the main stopper 53 can be turned against the biasing force of the spring 86, that is, the main stopper 53 can be disengaged from the IC element 16.

Figure 9:
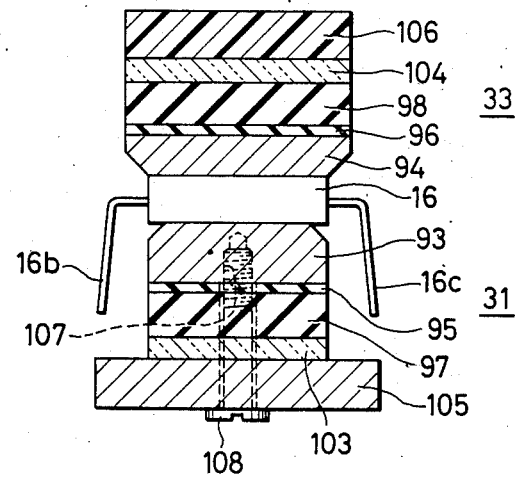
FIG. 9 is a sectional view illustrating, by way of example, a heating rails 31 and a guide member 33 which form another principal part of the present invention.

The heating rail 31 and the guide member 33 are respectively formed by heating members 93 and 94 on the side where they make contact with the body of the IC element 16, as depicted in FIG. 9 in which they are shown in section. The heating members 93 and 94 are formed of a material which is excellent in thermal conductivity and heat-resisting, such as beryllium copper, aluminum or the like, and they are plate-shaped members of uniform thickness. The heating members 93 and 94 are covered all over the outside surfaces thereof with resilient material layers 95 and 96, respectively. The resilient material layers 95 and 96 are formed by films of a resilient and heat-resisting material of excellent thermal conductivity, for example, silicon rubber.

Figure 10:
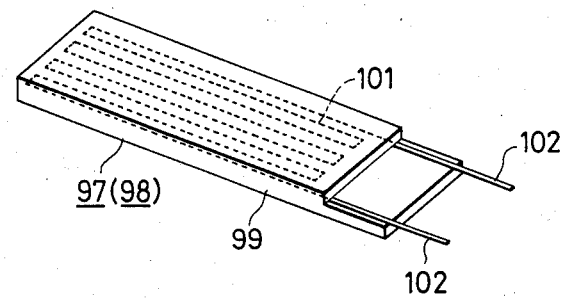
FIG. 10 is a perspective view illustrating an example of a ceramic heater.

Plate-shaped ceramic heaters 97 and 98 are mounted on the resilient material layers 95 and 96 to cover the entire areas of their outside surfaces, respectively. For example, as shown in FIG. 10, the ceramic heater has a heating wire 101 buried in a ceramic plate 99 throughout it, and leads 102 are led out of one end of the ceramic plate 99. The ceramic plate 99 can be heated substantially uniformly all throughout it. The ceramic heaters 97 and 98 are covered with heat-insulating layers 103 and 104 on the outside thereof, respectively. The heat-insulating layers 103 and 104 are formed of a material which is heat-resisting, poor in thermal conductivity and resilient, such as rubber. In this example, the heat-insulating layers 103 and 104 are provided in contact with the entire areas of the outer surfaces of the ceramic heaters 97 and 98.

Further, heater holders 105 and 106 are mounted on the heat-insulating layers 103 and 104, respectively. The heater holders 105 and 106 are formed by laminated plates of a material which is heat-resisting, poor in thermal conductivity and relatively hard, such as polyimide resin. The heater holder 105 resiliently presses the resilient material layer 95, the ceramic heater 97 and the heat-insulating layer 104 against the heating member 93, and the heater holder 106 presses the resilient material layer 96, the ceramic heater 98 and the heat-insulating layer 104 against the heating member 94. By tightening a bolt 108 inserted into a tapped hole 107 in the heating member 93 through holes made in the resilient material layer 95, the ceramic heater 97, the heat-insulating layer 103 and the heater holder 105 in alignment with the tapped hole 107, as indicated by the broken lines, the ceramic heater 97 is firmly held between the heating member 93 and the heater holder 105 so that they are mechanically formed as a unitary structure. In this way, the heating rail 31 is constituted. The guide member 33 can also be formed similarly, though not shown. One or both of the heating rail 23 and the guide member 25 of the preheating station 22 in FIGS. 1 and 2 can also be formed to have such as structure as described above.

Figure 11:
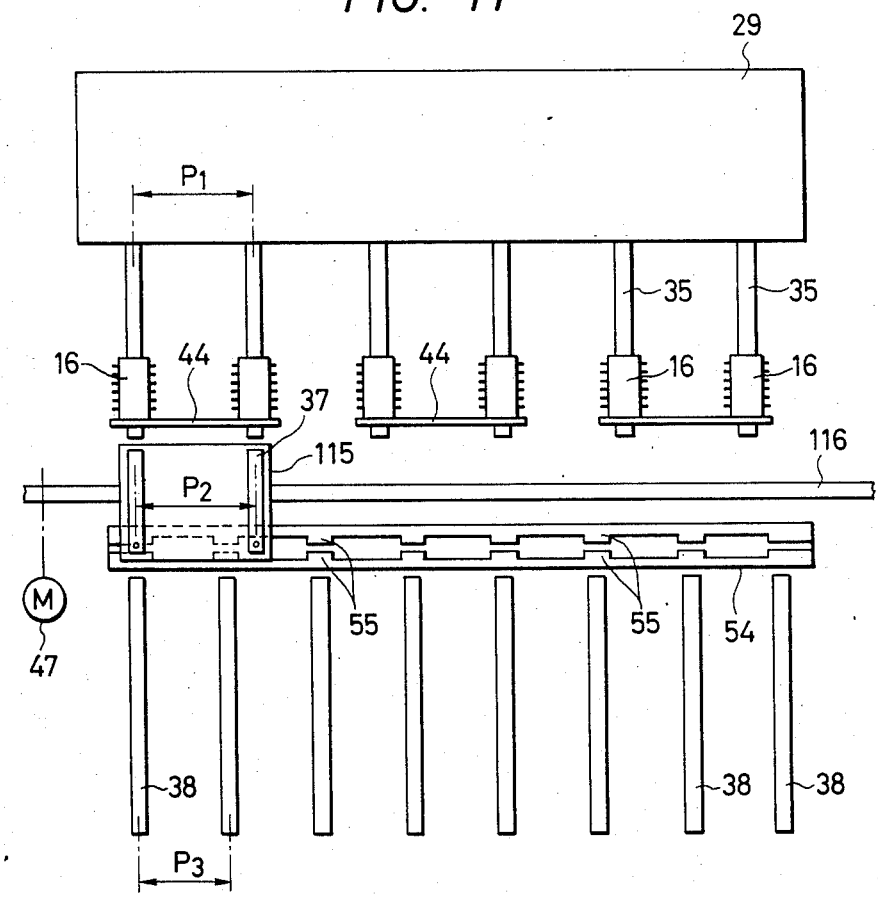
FIG. 11 is a plan view illustrating an example of a sorting station 36 which forms another principal part of the present invention.
Figure 12:
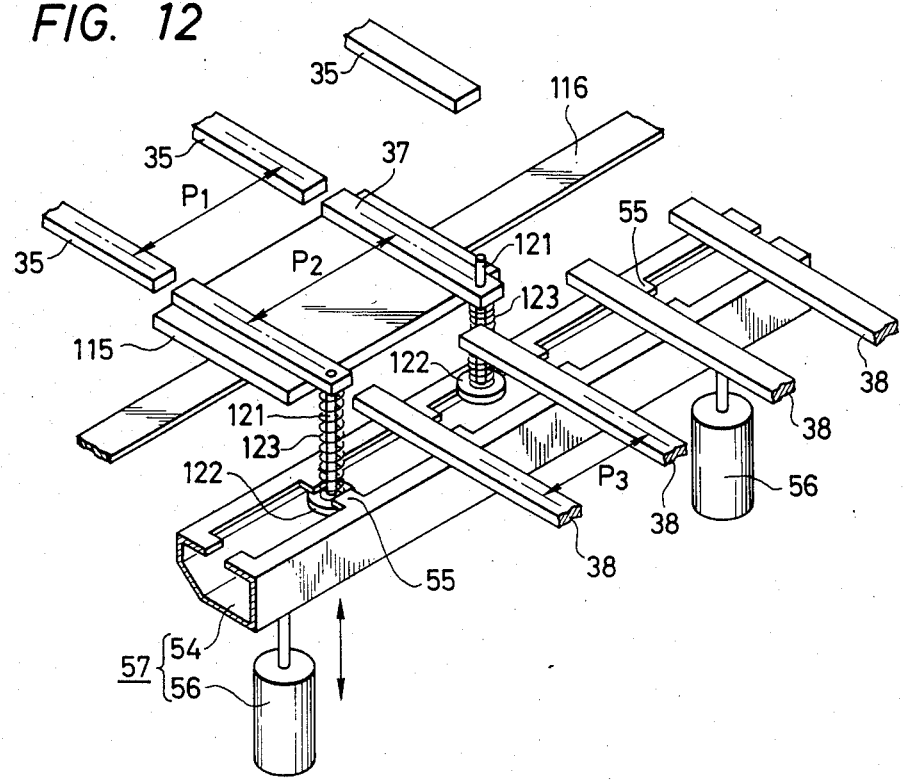
FIG. 12 is a perspective view showing a part of the sorting station depicted in FIG. 11.
Figure 13:
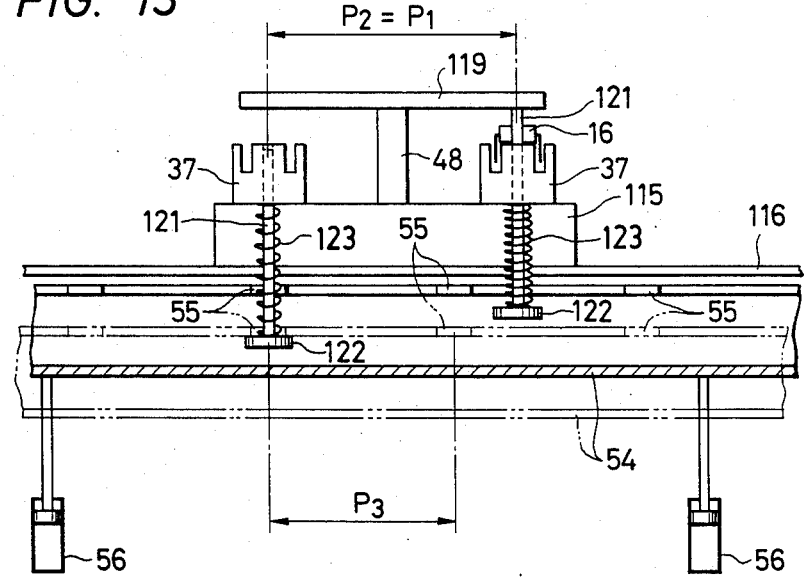
FIG. 13 is a front view showing a part of the sorting station with a driving member in front.

In the sorting station 36 shown in FIGS. 1 and 2, the spacing $P_1$ of the discharge rails 35 and the spacing $P_2$ of the sorting rails 37 are selected equal to each other, but these spacings and the spacing $P_3$ of the receiving rails 38 can be selected different, as shown in FIGS. 11 to 13. A stopper is provided for stopping the IC element 16 on each sorting rail 37. For instance, the sorting rails 37 are mounted on a moving plate 115, which is coupled with a belt, chain or like carrier 116 which extends in the direction of arrangement of the discharge rails 35. The carrier 116 is driven by a motor 47 to move the moving plate 115. As depicted in FIG. 13, a support 48 is planted on the moving plate 115, and a guide piece 119 is fixed on the support 48 in opposing relation to the sorting rails 37 so as to prevent the IC elements 16 from running off the sorting rails 37. The end portion of each sorting rail 37 on the side of the receiving rail 38 projects out of the moving plate 115, and a stopper pin 121 is provided to extend through the projecting end portion of the sorting rail 37 in a manner to be movable up and down. An engaging piece 122 is fixed to the lower end of the stopper pin 121, and a coiled spring 123 is mounted on the stopper pin 121 between the engaging piece 122 and the sorting rail 37 so that the stopper pin 121 is always biased by the coiled spring 123 toward the guide piece 119 to be held in contact therewith. Accordingly, the IC element 16 fed from the discharge rail 35 collides with the stopper pin 121 on the sorting rail 37 and held at a standstill thereon.

A bar-shaped driving member 54 is disposed to extend along the path of the engaging piece 122 of the stopper pin 121 which is moved with the sorting rail 37. The bar-shaped driving member 54 has a plurality of releasing pieces 55 formed therein in its lengthwise direction at regular intervals equal to the spacing $P_3$ of the receiving rails 38. In this example, the releasing pieces 55 are respectively positioned just under the receiving rails 38. When the driving member 54 is not driven, the engaging piece 122 is moved with the sorting rail 37 below the position of the releasing piece 55, as indicated by the solid line in FIG. 13. In this example, the driving member 54 is formed in the shape of a square tube and has a groove cut in its top face to extend in its lengthwise direction. Each engaging piece 122 is positioned in the body of the squared tubular driving member 54 through the groove, and the releasing pieces 55 are formed integrally with the driving member 54 to extend toward each other from both sides of the groove. The spacing of the opposing releasing pieces 55 is selected smaller than the diameter of the disc-shaped engaging piece 122. The bar-shaped driving member 54 is adapted to be driven up and down in FIG. 12, for example, at both ends thereof, by means of penumatic cylinders 56.

With such an arrangement as described above, by moving one sorting rail 37 into opposing relation to one of the receiving rails 38 which is to receive the IC element 16 on the sorting rail and then by controlling the pneumatic cylinders 56 to pull down the driving member 54, only the releasing piece 55 at the position of the receiving rail 38 corresponding to the sorting rail 37 engage the engaging piece 122 of that sorting rail 37 to pull down the stopper pin 55 against the biasing force of the coiled spring 123, releasing the IC element 16 from the stopper to be fed to the receiving rail 38. In this case, since the spacing $P_2$ of the sorting rails 37 differs from the spacing $P_3$ of the receiving rails 38, the engaging piece 122 of the other sorting rail 37 does not engage with any of the releasing pieces 55, holding the IC elements 16 on the other sorting rail 37. The driving member 54, the releasing pieces 55 and the pneumatic cylinders 56 constitute a releasing mechanism 57.

Figure 14A:
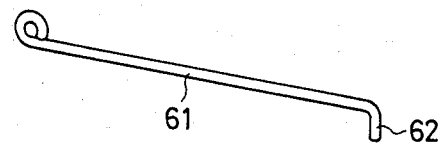
FIGS. 14A and 14B are side views illustrating other examples of auxiliary stopper.
Figure 14B:
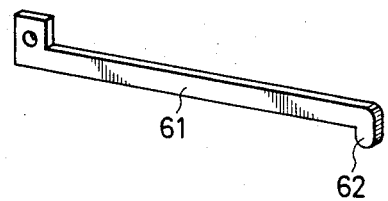

Incidentally, the movement of the IC element to the respective part need not always be effected by the weight of its own but may also be accomplished by various carrying means or through utilization of pneumatic pressure. The loader 11 need not always be automatic, but the magazine 12a may also be loaded manually by an operator. It is also possible to omit the preheating station 22 and to heat the IC elements 16 up to a predetermined temperature in the testing station 29 alone. In accordance with an aspect of the present invention, the heating means may also be dispensed with so that the IC elements are tested only at room temperature. Further, the test equipment of the present invention need not always be provided with a plurality of testing passages for parallel processing of IC elements but may also be provided with one testing passage. Also it is possible to omit, the receiving rails 38 and to supply the IC elements directly from the sorting station 36 to the magazines 41 of the unloader 39. Moreover, the auxiliary stopper may also be such as shown in FIGS. 14A and B.

In accordance with another aspect of the present invention, in the testing station 29, the IC element slides down the rail while being resiliently pressed against the sliding surface of the rail by the auxiliary stopper so that it slows down and engages the engaging piece of the auxiliary stopper to stop at a predetermined position about 3 to 5 millimeters short of the testing position. Accordingly, there is no possibility that the standstill position of the IC element by the auxiliary stopper changes according to the type of the IC element and it runs against the main stopper to bend its terminal pins. Moreover, the IC element can always be placed at the correct testing position, and hence can be measured correctly. In the case where the recess 63 is provided, even if the auxiliary stopper is vibrated, the engaging piece 61 does not scrape the sliding surface of the rail and the IC element can be fed to the main stopper without fail. Further, since the IC element is urged by the auxiliary stopper against the sliding surface of the rail and since the auxiliary stopper is fixed to the part which supports the rail, there is no fear of the IC element falling off the rail in the case of inspecting the inside of the equipment with the guide members taken off.

In accordance with another aspect of the present invention, the heating rail 31 and the guide member 33 heat the IC element 16 while guiding it. As the heating means, the ceramic heaters 97 and 98 are employed, which are thin, plate-shaped members which can be heated uniformly throughout then. They can be held in contact with substantially the entire areas of the surfaces of the heating members 93 and 94, respectively. In this case, the resilient material layers 95 and 96 are provided inside the ceramic heaters 97 and 98, respectively, so as to increase heat conduction from the ceramic heaters to the heating members and to mechanically protect the relatively brittle ceramic heaters. Furthermore, the resilient heat-insulating layers 103 and 104 are provided outside the ceramic heaters 97 and 98, respectively, so as to prevent heat from escaping from the heaters and to mechanically protect them. This ensures uniform heating of the heating members 93 and 94 by the heat from the ceramic heaters 97 and 98. Accordingly, even if the heating rail 31 is reduced in volume and in length, the IC element can be heated sufficiently. One possible technique for improving the heat conduction between the ceramic heaters 97, 98 and the heating members 93, 94, that is, for holding them in closer contact, is to use silicone grease. But the use of silicone grease involves an additional process in the manufacture of the heating rail and the guide member, besides it introduces the possibility that the silicone grease oozes out to dirty terminal pins 16b and 16c of the IC element 16 on the rail, imparing the electrical contact between them and the contacts of the test equipment during the test. The use of the resilient material layers of silicon rubber, as in the present invention, eliminates such a possibility, ensures thermally holding the ceramic heaters in close contact with the heating members and mechanically protects the ceramic heaters. This heating means can easily be produced simply by laminating plate-shaped or film-like members and clamping them with, for instance, a screw.

Figure 15:
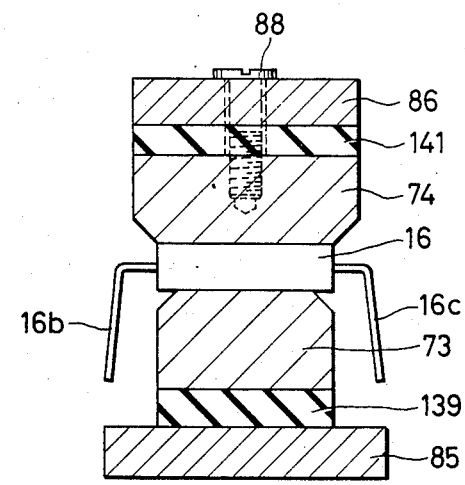
FIG. 15 is a sectional view illustrating other examples of the heating rail 31 and the guide member 31.

The ceramic heaters 97 and 98 can also be replaced with silicone rubber heaters, which have heating wires distributed in a sheet of silicone rubber for heating it substantially uniformly throughout it. In such an instance, the heating rail 31 is formed to hold a silicone rubber heater 139 directly between the heating member 93 and the heater holder 105, and the guide member 33 is similarly formed to hold a silicon rubber heater 141 directly between the heating member 94 and the heater holder 106, as shown in FIG. 15. Incidentally, these heater structures can be used for any one of the rails 23, 31 and the guide members 25, 33.

In accordance with another aspect of the present invention, since the plurality of sorting rails 37 are provided and since their spacing $P_2$ is selected equal to the spacing $P_1$ of the discharge rails 35, the IC elements supplied from the plurality of discharge rails 35 can simultaneously be fed onto the plurality of sorting rails 37. Accordingly, the IC elements can be quickly transferred from the discharge rails 35 to the sorting rails 37. Further, the IC elements on the sorting rails 37 can be supplied to the desired receiving rails 38 in succession while moving the sorting rails 37, so the time for supplying the IC elements to the receiving rails 38 can also be reduced. Since the stopper pins 121 on the sorting rails 37 can selectively be released, the IC elements held thereon can selectively be transferred to the receiving rails 38. In addition, since the spacing $P_2$ of the sorting rails 37 is selected different from the spacing $P_3$ of the stopper pins 121 but equal to the spacing of the releasing pieces 55, the stopper pins 121 can be released by the common driving member 54. As compared with the case of driving the stopper pins individually, the number of driving means, for example, pneumatic cylinders, can be decreased and the entire structure can be simplified.

Letting the numbers of the discharge rails 35, the sorting rails 37 and the receiving rails 38 be represented by $N_1$, $N_2$ and $N_3$, respectively, when $N_1 > (N_2 - 1) \times 2 + N_3$, to select the spacing $P_1$ of the discharge rail 35 smaller than the spacing $P_3$ of the receiving rails 38 reduces the space in the direction of arrangement of the rails by $(N_1 - 1) \times (P_3 - P_1)$ as compared with the conventional equipment in which the spacing $P_1$ and the spacing $P_3$ are equal to each other.

Further, when $N_1 < (N_2 - 1) \times 2 + N_3$, to select the spacing $P_1$ larger than the spacing $P_3$ reduces the space in the direction of arrangement of the rails by $\{(N_2 - 1) \times 2 + N_3 - 1\} \times (P_1 - P_3)$ as compared with the case where the spacing $P_1$ and the spacing $P_3$ are equal to each other. That is, when $P_1 : P_3 = n_1 : n_3$, $(n_1 + 1)$ receiving rails 38 can be disposed at equal intervals $P_3$ in a space needed for providing the discharge rails 35 at intervals $P_1$. Moreover, letting the least common multiple of $P_2$ and $P_3$ be represented by P, the IC element on only one of the sorting rails 37 can be transferred to the corresponding receiving rail 38 by selecting the number $N_2$ to be $N_2 \leq P/P_3$ when $P_1 > P_3$ and $N_2 = P/P_1$ when $P_1 < P_3$. The actuator of the stopper releasing mechanism may be single.

It will be apparent that many modifications and variations may be effected without departing from the scope of the novel concepts of the present invention.

What is claimed is:

1. IC test equipment comprising:
   a loader for loading IC elements to be tested;
   a testing station for testing the IC elements supplied from the loader;
   a sorting station supplied with the IC elements tested in the testing station, for sorting them according to their test results; and
   an unloader for receiving the IC elements sorted by the sorting station;
   wherein the testing station comprises:
   rails for guiding the IC elements supplied from the loader;
   an auxiliary stopper disposed opposite but aslant to the IC element sliding surface of each rail so that it goes away from the sliding surface of the rail as the IC element supply side is approached, the end portion of the auxiliary stopper on the opposite side from the IC element supply side being bent substantially at right angles to the sliding surface of the rail to form an engaging piece, the auxiliary stopper resiliently pressing the IC element sliding down the rail against the sliding surface thereof and engaging the IC element with the engaging piece to stop it;
   means for controlling the auxiliary stopper to disengage it from the IC element; and
   a main stopper disposed slightly ahead of the engaging piece of the auxiliary stopper whereby the IC element disengaged by the disengaging means from the auxiliary stopper and sliding down the rail is stopped at the position for test.

2. IC test equipment according to claim 1 further comprising means for biasing the engaging piece of the auxiliary stopper toward the sliding surface of the rail.

3. IC test equipment according to claim 2 wherein a recess is made in the sliding surface of the rail for receiving the engaging piece of the auxiliary stopper.

4. IC test equipment according to claim 2 wherein the biasing means comprises a rotary arm having connected thereto at one end the end portion of the auxiliary stopper opposite from the engaging piece thereof and a coiled spring for biasing the rotary arm to turn in a direction in which the engaging piece of the auxiliary stopper approaches the sliding surface of the rail, and wherein the disengaging means is a driving means capable of turning the rotary arm against the biasing force of the coiled spring.

5. IC test equipment according to claim 4 further comprising an adjustment means for engagement with the rotary arm in its turning direction, wherein the adjustment means adjusts the angular position of the rotary arm, thereby changing the position of the engaging piece of the auxiliary stopper relative to the sliding surface of the rail when it is out of engagement with the IC element.

6. IC test equipment according to claim 1 wherein the auxiliary stopper is formed by a piano wire.

7. IC test equipment according to claim 1 wherein the rail is disposed to extend substantially vertically and a guide member is disposed opposite the sliding surface of the rail so as to prevent the IC element sliding down the rail from running off the rail, the guide member being movable relative to the rail.

8. IC test equipment according to claim 7 further comprising a second auxiliary stopper disposed opposite the sliding surface of the rail at a position further to the IC element supply side than the firstly mentioned auxiliary stopper, the end portion of the second auxiliary stopper on the side of the main stopper being bent at right angles to the sliding surface of the rail to form an engaging piece, the IC element supplied to the testing station being resiliently pressed by the second auxiliary stopper against the sliding surface of the rail and engaged with the engaging piece of the second auxiliary stopper to be stopped thereby, and means for disengaging the IC element from the engaging piece of the second auxiliary stopper.

9. IC test equipment comprising:
a loader for loading IC elements to be tested;
a testing station for testing the IC element supplied from the loader;
a sorting station supplied with the IC elements tested in the testing station, for sorting them according to their test results; and
an unloader for receiving the IC elements sorted by the sorting station;
wherein the testing station has a plurality of testing passages for simultaneously testing the IC elements and a plurality of discharge rails arranged in parallel at equal intervals for guiding the tested IC elements from the testing station to the sorting station;
wherein the unloader has a plurality of equally spaced receiving passages arranged in parallel in the same direction of arrangement as that of the discharge rails of the sorting station but on the opposite side therefrom, the spacing of the receiving passages being different from the spacing of the discharge rails; and
wherein the sorting station has a plurality of sorting rails arranged in parallel with the discharge rails at the same intervals as those of the discharge rails, a moving mechanism for simultaneously moving the sorting rails in the direction of arrangement of the discharge rails, a stopper provided for each sorting rail for holding thereon the IC element supplied from the discharge rail corresponding thereto and a stopper releasing mechanism for selectively releasing the stoppers from their IC element holding state.

10. IC test equipment according to claim 9 wherein the stopper releasing mechanism is provided with a driving member disposed between the sorting rails and the receiving passages and extending in the direction of arrangement of the receiving passages, releasing pieces formed integrally with the driving member and arranged in its lengthwise direction at the same intervals as those of the receiving passages for engagement with one of the stoppers and driving member control means whereby when one of the releasing pieces and one of the stoppers are in engagement with each other, the driving member is moved to release the IC element from the stopper.

11. IC test equipment according to claim 10 wherein the moving mechanism comprises a moving member having mounted thereon the plurality of sorting rails in common thereto, a carrier carrying the moving member and provided to extend in the direction of movement of the sorting rails and control means for moving the carrier in the direction of its extension.

12. IC test equipment according to claim 11 wherein a guide member is mounted on the moving member in opposing relation to each sorting rail for guiding the IC element thereon in a manner to prevent the IC element from running off the sorting rail.

13. IC test equipment according to claim 11 wherein each of the stoppers is held on the moving member in a manner to be movable substantially perpendicularly to the IC element sliding surface of the corresponding sorting rail and biased by a spring in a direction in which its one end approaches the sliding surface of the sorting rail, the other end portion of each stopper has an engaging piece for engagement with the releasing pieces in a direction prependicular to the sliding surface of the sorting rail, and wherein the driving member is movable by the driving member control means in a direction substantially perpendicular to the sliding surface of the sorting rail.

14. IC test equipment according to claim 13 wherein the driving member is a squared tubular member almost open in its one side, projecting pieces being formed integrally with the driving member to extend from both sides of its open side toward each other and a pair of such projecting pieces constituting each of the releasing piece, and wherein when the releasing piece and the stopper are not in engagement with each other, the engaging piece is positioned in the driving member and the stopper is released by controlling the driving member when one of the engaging piece and one of the releasing piece lie opposite each other.

* * * * *